(12) United States Patent  (10) Patent No.: US 9,061,479 B2
Choi et al.  (45) Date of Patent: Jun. 23, 2015

(54) COATING LAYER WITH LOW-FRICTION FOR VEHICLE COMPONENT AND METHOD FOR PRODUCING THE SAME

(71) Applicant: Hyundai Motor Company, Seoul (KR)

(72) Inventors: Kwang Hoon Choi, Gyeonggi-do (KR); In Woong Lyo, Suwon (KR); Woong Pyo Hong, Yongin (KR); Hyuk Kang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/509,003

(22) Filed: Oct. 7, 2014

(65) Prior Publication Data

US 2015/0021165 A1    Jan. 22, 2015

Related U.S. Application Data

(62) Division of application No. 13/537,358, filed on Jun. 29, 2012, now Pat. No. 8,871,336.

(30) Foreign Application Priority Data

Nov. 15, 2011    (KR) .................. 10-2011-0118709

(51) Int. Cl.
   *C23C 14/34*    (2006.01)
   *B32B 9/04*     (2006.01)
   *B32B 15/04*    (2006.01)
   *C23C 14/06*    (2006.01)
   *C23C 14/14*    (2006.01)
   *C23C 14/22*    (2006.01)

(52) U.S. Cl.
   CPC ............... *B32B 9/04* (2013.01); *Y10T 428/265* (2015.01); *Y10T 428/24975* (2015.01); *Y10T 428/31678* (2015.04); *B32B 15/04* (2013.01); *C23C 14/06* (2013.01); *C23C 14/14* (2013.01); *C23C 14/34* (2013.01); *C23C 14/0641* (2013.01); *C23C 14/0688* (2013.01); *C23C 14/22* (2013.01); *B32B 9/041* (2013.01)

(58) Field of Classification Search
   USPC ............................ 204/192.1, 192.15, 192.16
   See application file for complete search history.

(56) References Cited

FOREIGN PATENT DOCUMENTS

| JP | S61-0084393 | 4/1986 |
| JP | H06-299329 | 10/1994 |
| JP | H07-101789 | 4/1995 |
| KR | 10-1999-0016287 | 3/1999 |
| KR | 10-2011-0055473 | 5/2011 |

OTHER PUBLICATIONS

Han, J.G. et al., "Microstructure and mechanical properties of Ti—Ag—N and Ti—Cr—N superhard nanostructured coatings," Surface and Coatings Technology, 174-175, pp. 738-743 (2003).

*Primary Examiner* — Archene Turner

(74) *Attorney, Agent, or Firm* — Mintz Levin Cohn Ferris Glovsky and Popeo, P.C.; Peter F. Corless

(57) ABSTRACT

The present invention provides a low-friction coating layer for vehicle components comprising: a Ti layer on a surface of a base material; a TiN layer on the Ti layer surface; a TiAgN layer on the TiN layer surface; and an Ag layer transferred on the TiAgN layer surface, and a method for producing the same.

13 Claims, 4 Drawing Sheets

COATING LAYER WITH LOW-FRICTION FOR VEHICLE COMPONENT AND METHOD FOR PRODUCING THE SAME

CROSS-REFERENCE TO RELATED APPLICATION

This application is a Divisional Application of U.S. patent application Ser. No. 13/537,358 filed Jun. 29, 2012, which claims under 35 U.S.C. §119(a) the benefit of Korea Patent Application No. 10-2011-0118709 filed on Nov. 15, 2011, the entire contents of which are incorporated herein by reference.

BACKGROUND (a) Technical Field

The present disclosure relates to a low-friction TiAgN coating material for vehicle component. More particularly, the present disclosure relates to a low-friction TiAgN coating material, which has not only high-stiffness and low-friction characteristics like DLC, but also high temperature wear resistance, and a method for producing the same.

(b) Background Art

In general, a plasma coating technique may be used to coat an untreated material with another material, thereby adding mechanical and functional characteristics to the untreated material. Plasma coating techniques may be divided into two general categories: chemical vapor deposition (CVD) and physical vapor deposition (PVD).

Several types of PVD are in common use such as, for example, vacuum deposition, sputtering, Ion plating, and the like. I Ion plating is being used in various coating methods according to the plasma activations method and coating material ionization methods. For example, the arc ion plating is used to vapor ionize a coating material (target) as a negative electrode using arc discharge; consequently, it has been successfully used for hard coating because it has rapid a coating rate due to its rapid evaporation rate, which generates good productivity, as well as high ionization, crash, and migration energies.

Diamond like carbon (DLC) coating has been mainly used for a low-friction coating for conventional vehicle components. However, while DLC coating has an advantage in that it has already been mass-produced and broadly used, it suffers from significant problems because it has low abrasion resistance and insufficient friction characteristics at both high and low temperature. Furthermore, it also has a problem of relatively long friction stable sections.

Therefore, there is a need in the art for a component coating layer that has high-stiffness properties, low friction properties, and high temperature wear properties to replace this conventional DLC coating.

SUMMARY OF THE DISCLOSURE

The present invention provides a low-friction coating material of TiAgN for a vehicle component, which has not only the high-stiffness and low-friction characteristics of DLC, but also high temperature wear resistance, and a method for producing the same.

According to an exemplary embodiment of the invention, the low-friction TiAgN coating layer for vehicle component includes a Ti layer of base material surface; a TiN layer on the Ti layer surface; a TiAgN layer on the TiN layer surface; and an Ag layer transferred on the TiAgN layer surface. More specifically, the coating layer comprises: a Ti layer deposited on the base material surface by a Ti arc source; a TiN layer deposited on the Ti layer surface by a Ti arc source and nitrogen gas; a TiAgN layer deposited on the TiN layer surface by a Ti arc source, an Ag sputtering source and nitrogen gas; and a Ag layer transferred on the TiAgN layer surface by shearing and vertical loads after being deposited on the TiAgN layer surface by an Ag sputtering source.

The thicknesses of the Ti layer, the TiN layer, the TiAgN layer and the Ag layer may range from about 0.08 to 0.15 µm, about 0.05 to 0.1 µm, about 1.5 to 2 µm, and about 0.1 µm or less (not including 0), respectively.

A coating method according to an exemplary embodiment of the invention for producing the coating layer includes: a preparation step of cleaning a base material surface and then preparing the internal atmosphere of a deposition chamber to the vacuum/high temperature atmosphere; the first buffer step of depositing a Ti layer on the base material surface by a Ti arc source; the second buffer step of depositing a TiN layer on the Ti layer surface by a Ti arc source and nitrogen gas; the first coating step of depositing a TiAgN layer on the TiN layer surface by a Ti arc source, an Ag sputtering source and nitrogen gas; and the second coating step of depositing an Ag layer on the TiAgN layer surface by an Ag sputtering source. In the second coating step, after depositing the Ag layer, the Ag layer can be transferred to the surface of the TiAgN layer by shearing and vertical loads.

The preparation step can form the vacuum of $10^{-5} \sim 10^{-6}$ torr and a high temperature atmosphere of 400 to 500° C.

The first buffer step can form the Ti layer o a thickness of about 0.08 to 0.15 µm. The second buffer step can form the TiN layer to a thickness of about 0.05 to 0.1 µm. The first coating step can form the TiAgN layer to a thickness of about 1.5 to 2 µm. The second coating step can form the Ag layer to a thickness of about 0.1 µm or less (not including 0).

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
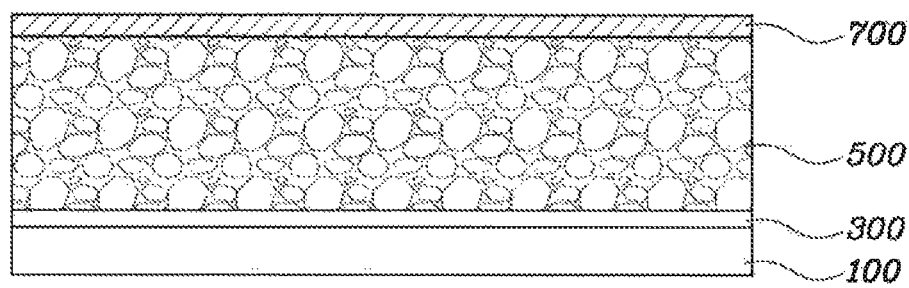
FIGS. 1 and 2 are drawings representing a cross section and a production process for the low-friction coating layer according to an exemplary embodiment of the present invention.

It should be understood that the appended drawings are not necessarily to scale, presenting a somewhat simplified representation of various preferred features illustrative of the basic principles of the invention. In the figures, reference numbers refer to the same or equivalent parts of the present invention throughout the several figures of the drawing.

DETAILED DESCRIPTION

Hereinafter reference now be made in detail to various embodiments of the present invention, examples of which are illustrated in the accompanying drawings and described below. While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Ranges provided herein are understood to be shorthand for all of the values within the range. For example, a range of 1 to 50 is understood to include any number, combination of numbers, or sub-range from the group consisting of 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50, as well as all intervening decimal values between the aforementioned integers such as, for example, 1.1, 1.2, 1.3, 1.4, 1.5, 1.6, 1.7, 1.8, and 1.9. With respect to sub-ranges, "nested sub-ranges" that extend from either end point of the range are specifically contemplated. For example, a nested sub-range of an exemplary range of 1 to 50 may comprise 1 to 10, 1 to 20, 1 to 30, and 1 to 40 in one direction, or 50 to 40, 50 to 30, 50 to 20, and 50 to 10 in the other direction.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Hereinafter, a low-friction coating layer for a vehicle component, and a method for producing the same according to the e preferred embodiments of the present invention will be described in detail with reference to the accompanying drawings.

Figure 2:
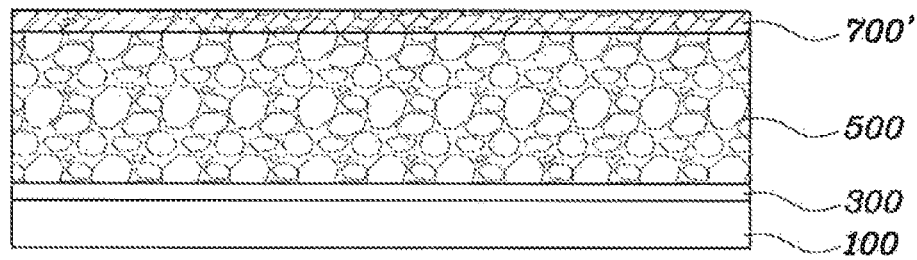

FIGS. 1 and 2 are drawings representing a cross section and a producing process of the low-friction coating layer with according to an exemplary embodiment of the present invention. The low-friction coating layer of the present invention includes a Ti layer base material surface 100; a TiN layer 300 on the Ti layer 100 surface; a TiAgN layer 500 on the TiN layer 300 surface; and an Ag layer 700' transferred on the TiAgN layer 500 surface. In other words, the low-friction coating layer includes a Ti base layer 100, a TiN layer 300, and a TiAgN layer 500, where the TiN layer 300 is sandwiched between the Ti base layer 100 and the TiAgN layer 500. Additionally, an Ag layer 700' is transferred into the TiAgN layer.

More specifically, the low-friction coating layer for vehicle component of the present invention comprises: a Ti layer 100 deposited on the base material surface by a Ti arc source; a TiN layer 300 deposited on the Ti layer 100 surface by a Ti arc source and nitrogen gas; a TiAgN layer 500 deposited on the TiN layer 300 surface by a Ti arc source, Ag sputtering source, and nitrogen gas; and an Ag layer 700 transferred on the TiAgN layer 500 surface by shearing and vertical loads after being deposited on the TiAgN layer 500 surface by an Ag sputtering source.

According to an exemplary embodiment of the invention, the thicknesses of the Ti layer 100, the TiN layer 300, the TiAgN layer 500, and the transferred Ag layer 700' may range from 0.08 to 0.15 μm, 0.05 to 0.1 μm, 1.5 to 2 μm, and 0.1 μm or less (not including 0), respectively.

According to an exemplary embodiment, a method to produce the low-friction coating layer for vehicle component includes: a preparation step of cleaning a base material surface and then preparing the internal atmosphere of a deposition chamber to the vacuum/high temperature atmosphere; a first buffer step of depositing a Ti layer on the base material surface by a Ti arc source; a second buffer step of depositing a TiN layer on the Ti layer surface by a Ti arc source and nitrogen gas; a first coating step of depositing a TiAgN layer on the TiN layer surface by a Ti arc source, an Ag sputtering source, and nitrogen gas; and a second coating step of depositing an Ag layer on the TiAgN layer surface by an Ag sputtering source. According to an exemplary embodiment, in the second coating step, after depositing the Ag layer, the Ag layer is transferred to the surface of the TiAgN layer by shearing and vertical loads.

The coating layer of the present invention can be formed by PVD (Physical vapor deposition). In this process, an initial cleaning process is conducted. In the cleaning step, as a pre-treatment step before coating the re-carburized base material surface, impurities on the surface of a test sample are removed by ultrasonic cleaning with ethanol (e.g., for about 10 to 15 min) and acetone (e.g., for about 3 to 5 min) and drying (e.g., for about 5 to 10 min), so as to obtain uniform coating quality, Then, in a vacuum process, the degree of vacuum is formed to $10^{-2}$ to $10^{-3}$ torr in a chamber using a rotary pump of a PVD equipment, and then the vacuum atmosphere is increased to $10^{-5}$ to $10^{-6}$ torr using a turbo Main Pump. The degree of vacuum of $10^{-2}$ torr or less is checked with an ion gauge located on top of the chamber, and the process is conducted at the degree of vacuum of $10^{-5}$ torr or less, In the heating process, the temperature in the chamber is set to about 400 to 500° C. or more, so as to facilitate reaction of N (nitrogen), and the heating time is set to about 40 to 60 min so as to make the surface and interior temperature distribution of a test sample to coat and the temperature atmosphere in the chamber uniform.

As in the above described cleaning process, the test sample, wherein the impurities were removed with ethanol and acetone, is cleaned using an ion gun for about 15 to 20 min or more to improve the adhesion property between a buffer layer and the base material. Then, the first buffer step, the second buffer step, the first coating step and the second coating step are conducted.

In the first buffer step, fixing the Ti layer using the ion source is conducted to improve the adhesion property of the TiAgN layer as a functional coating layer, and a Ti element and Ar gas is crashed into the test sample to coat to obtain the surface cleaning effect and to be implanted to the base material of the test sample by applying high power Bias (400 to 600 V) to the arc source (70 A to 80 A) having high energy density, and the deposition thickness is set to 0.08~0.15 μm.

In the second buffer step, if the TiAgN layer is directly deposited on the Ti layer, the adhesion property may be reduced by a stress singularity formed on the interface due to the difference in the lattice constant; consequently, it may become cause interfacial stress concentration, and ultimately cause the destruction of the coating layer. Therefore, the TiN layer is deposited to a thickness of 0.05 to 0.1 μm or less using the arc source (70 to 80 A) to improve bonding strength between interfaces.

In the first coating step, TiAgN layer coating (1.5 to 2 μm) is conducted by activating two ion sources of the arc source (80 to 120 V) and sputtering source (0.7 to 1 A). However, the arc source and the test sample are separated by a distance of 20 to 25 μm to prevent the deposition of macro particles, which can be formed from the arc source, so as to improve the surface roughness.

In the second coating step, the Ag layer is doped to 0.05 to 0.1 μm or s using the sputtering source (0.6 to 0.8 A) to improve the low-friction property of the functional element Ag unlike the improvement of adhesion property as the object of the conventional buffer. The surface roughness and running-in effect are embodied by forming a layer with Ag micro-particles against the Ti particles of the arc source to improve the friction property at real environment (combined load).

FIG. 1 represents a state of depositing the top Ag layer, and FIG. 2 represents a state of transferring the Ag layer to the TiAgN layer of a lower part by adding vertical and horizontal shearing forces. A part of the Ag layer is removed by load and friction, and another part is transferred to the TiAgN layer so as to form a modified TiAgN layer with strong functional characteristic of Ag (low-friction). Through this, as an initial friction stable property, a running-in effect (a state wherein the friction coefficient increases under the influence of the surface roughness on the contact surface at the beginning of an experiment, and then the roughness and the surface oxide film are removed followed by being stabilized) can also be fulfilled.

Finally, furnace cooling is conducted to the room temperature to prevent modification of the coating layer, and to make the characteristics uniform.

Figure 3:
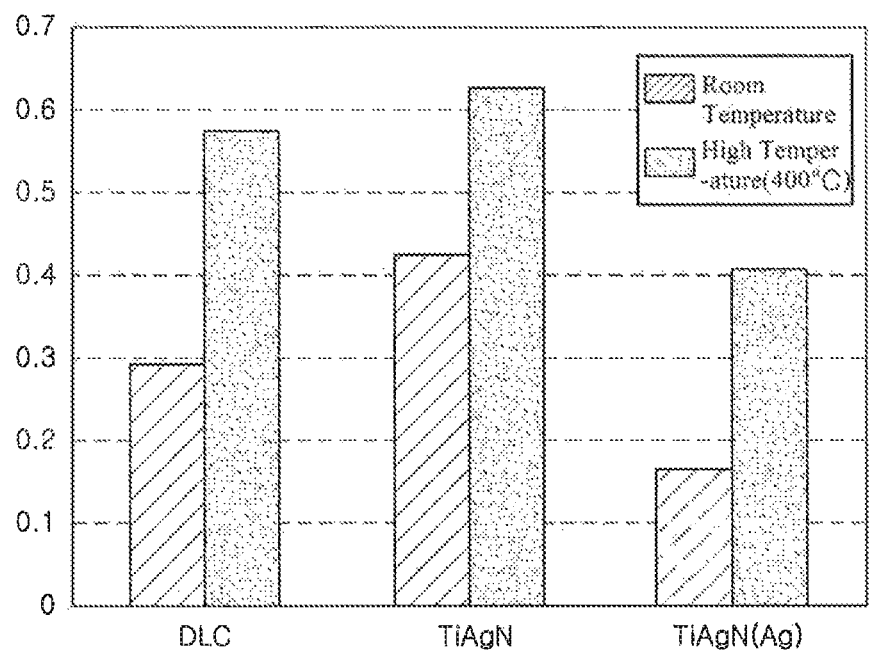
FIG. 3 is a graph comparing the friction coefficients of the coating layers illustrated in FIGS. 1 and 2 to the conventional art DLC coating.

FIG. 3 is a graph comparing the friction coefficients of the coating layers illustrated in FIGS. 1 and 2 to the conventional DLC coating. The friction characteristic at the room temperature, when the Ag layer was a transferred TiAgN (Ag), it was confirmed that the friction characteristic was improved 200% or more compared with that of the general TiAgN. Further, the friction characteristic at high temperature was improved 141% compared with the mass produced DLC. In other words, the high temperature wear resistance was improved.

Figure 4:
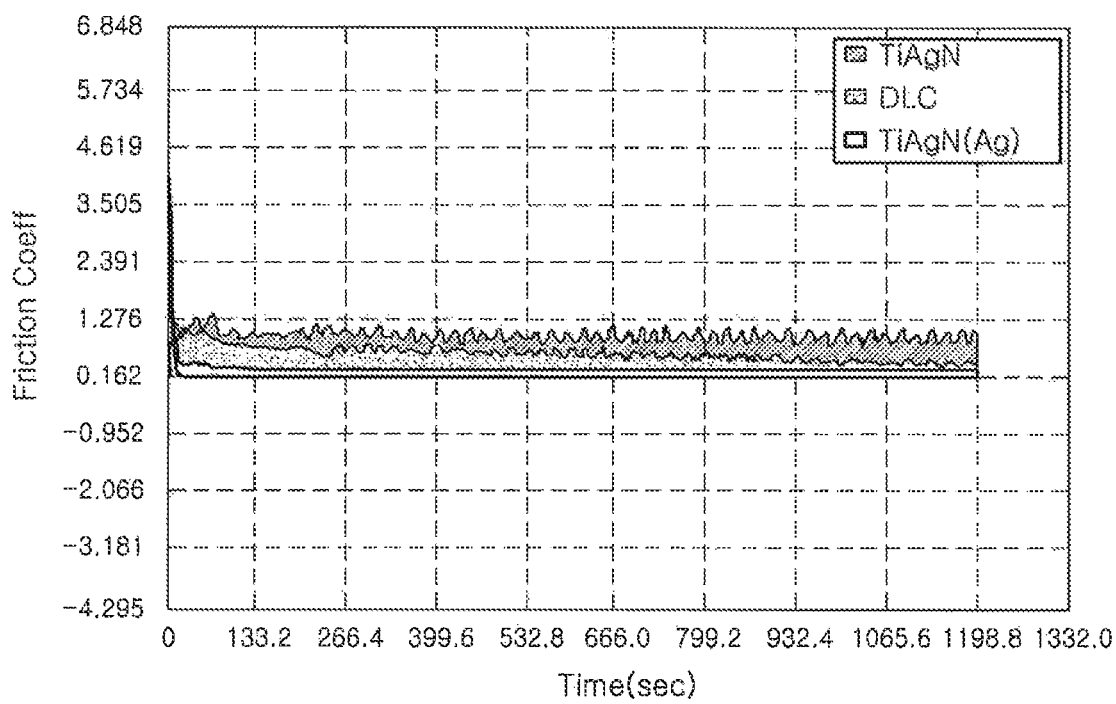
FIG. 4 is a graph comparing the friction stable sections of the coating layers illustrated in FIGS. 1 and 2 to the conventional DLC coating.

FIG. 4 is a graph comparing the friction stable sections of the coating layers illustrated in FIGS. 1 and 2 to the conventional DLC coating, When the Ag layer was a transferred TiAgN (Ag), it was confirmed that the friction characteristic was good, and, as the running-in effect, the friction stable section was reduced, compared with those of the mass produced DLC and general TiAgN.

The low-friction coating layer for vehicle component consisting of the exemplary structure described above and the method for producing the same, a TiAgN coating layer with not only high-stiffness and low-friction characteristics of DLC but also high temperature wear resistance can be provided.

While the invention will be described in conjunction with exemplary embodiments, it will be understood that the present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

What is claimed is:

1. A method for producing a low-friction coating layer comprising:
    (a) cleaning a base material surface;
    (b) preparing the internal atmosphere of a deposition chamber to a vacuum/high temperature atmosphere;
    (c) depositing the Ti layer on the base material surface by a Ti arc source;
    (d) depositing the TiN layer on the Ti layer surface by a Ti arc source and nitrogen gas;
    (e) depositing a TiAgN layer on the TiN layer surface by a Ti arc source, an Ag sputtering source, and nitrogen gas; and
    (f) depositing an Ag layer on the TiAgN layer surface by an Ag sputtering source.

2. The method of claim 1 further comprising:
    transferring the Ag layer to the surface of the TiAgN layer by shearing and vertical loads.

3. The method of claim 1 wherein the vacuum/high temperature atmosphere of step (b) comprises a vacuum of about 10-5 to 10-6 torr and a high temperature of about 400 to 500° C.

4. The method of claim 1 wherein the Ti layer is formed to a thickness of 0.08 to 0.15 μm.

5. The method of claim 1, wherein the TiN layer is formed to a thickness of 0.05 to 0.1 μm.

6. The method of claim 1, wherein the TiAgN layer is formed to a thickness of 1.5 to 2 μm.

7. The method of claim 1, wherein the Ag layer is formed to a thickness of 0.1 μm or less.

8. The method of claim 7 wherein the Ag layer is formed to a thickness of 0.1 to 0.0000000001 μm.

9. The method of claim 1 wherein the low-friction coating layer comprises:
    a Ti layer;
    a TiN layer;
    a TiAgN layer, wherein the TiN layer is sandwiched between the Ti layer and the TiAgN layer; and
    an Ag layer transferred onto the TiAgN layer surface.

10. The method of claim 2 wherein the low-friction coating layer comprises:
    a Ti layer;
    a TiN layer;
    a TiAgN layer, wherein the TiN layer is sandwiched between the Ti layer and the TiAgN layer; and
    an Ag layer transferred onto the TiAgN layer surface.

11. The method of claim 3 wherein the low-friction coating layer comprises:
    a Ti layer;
    a TiN layer;
    a TiAgN layer, wherein the TiN layer is sandwiched between the Ti layer and the TiAgN layer; and
    an Ag layer transferred onto the TiAgN layer surface.

12. The method of claim 4 wherein the low-friction coating layer comprises:
    a Ti layer;
    a TiN layer;
    a TiAgN layer, wherein the TiN layer is sandwiched between the Ti layer and the TiAgN layer; and
    an Ag layer transferred onto the TiAgN layer surface.

13. The method of claim 5 wherein the low-friction coating layer comprises:
    a Ti layer;
    a TiN layer;
    a TiAgN layer, wherein the TiN layer is sandwiched between the Ti layer and the TiAgN layer; and
    an Ag layer transferred onto the TiAgN layer surface.

* * * * *